::: United States Patent (10) Patent No.: US 6,884,334 B2
Volodarsky et al. (45) Date of Patent: Apr. 26, 2005

(54) VERTICALLY CONFIGURED CHAMBER USED FOR MULTIPLE PROCESSES

(75) Inventors: Konstantin Volodarsky, San Francisco, CA (US); Boguslaw A. Nigorski, San Jose, CA (US); Rimma Volodarsky, San Francisco, CA (US); Douglas W. Young, Sunnyvale, CA (US); Cyprian Uzoh, Milpitas, CA (US); Homayoun Talieh, San Jose, CA (US)

(73) Assignee: ASM NuTool, Inc., Fremont, CA (US)

( * ) Notice: Subject to any disclaimer, the term of this patent is extended or adjusted under 35 U.S.C. 154(b) by 237 days.

(21) Appl. No.: 10/041,058

(22) Filed: Dec. 28, 2001

(65) Prior Publication Data

US 2002/0056646 A1 May 16, 2002

Related U.S. Application Data

(62) Division of application No. 09/466,014, filed on Dec. 17, 1999, now Pat. No. 6,352,623.

(51) Int. Cl.[7] ............................................... C25D 5/00
(52) U.S. Cl. .................... 205/87; 205/220; 205/117; 427/331; 427/346; 427/372.2; 118/500; 118/730; 118/409; 134/32; 134/153; 134/143
(58) Field of Search ................................. 205/220, 117, 205/87; 427/331, 346, 372.2; 118/500, 730, 409; 134/32, 153, 143

(56) References Cited

U.S. PATENT DOCUMENTS 5,922,138 A   7/1999   Shindo et al. ................. 134/2

6,131,588 A * 10/2000 Kamikawa et al. ...... 134/102.3
6,168,691 B1   1/2001   Kauper et al. .......... 204/224 R
6,187,152 B1   2/2001   Ting et al. .............. 204/224 R

FOREIGN PATENT DOCUMENTS

| DE | 44 21 010 | 12/1995 |
| DE | 198-32 038 | 1/1999 |
| EP | 0 501 777 | 9/1992 |
| EP | 0 845 357 | 6/1998 |
| EP | 0 855 736 | 7/1998 |
| EP | 0 869 542 | 10/1998 |
| EP | 0 909 837 | 4/1999 |

* cited by examiner

Primary Examiner—Wesley A. Nicolas
(74) Attorney, Agent, or Firm—Knobbe, Martens, Olson & Bear, LLP (57) ABSTRACT

The present invention relates to a containment chamber that is used for carrying out multiple processing steps such as depositing on, polishing, etching, modifying, rinsing, cleaning, and drying a surface on the workpiece. In one example of the present invention, the chamber is used to electro chemically mechanically deposit a conductive material on a semiconductor wafer. The same containment chamber can then be used to rinse and clean the same wafer. As a result, the present invention eliminates the need for separate processing stations for depositing the conductive material and cleaning the wafer. Thus, with the present invention, costs and physical space are reduced while providing an efficient apparatus and method for carrying out multiple processes on the wafer surface using a containment chamber.

20 Claims, 8 Drawing Sheets

VERTICALLY CONFIGURED CHAMBER USED FOR MULTIPLE PROCESSES

This application is a divisional of 09/466,014 filed Dec. 17, 1999 now U.S. Pat. No. 6,352,623.

FIELD OF THE INVENTION

The present invention relates to methods and apparatus for carrying out multiple processes such as depositing, plating, polishing, etching a conductive material and rinsing, cleaning, and modifying the surface of a substrate using a vertically configured containment chamber. More particularly, the present invention is directed to a vertically configured containment chamber that can be used for carrying out a first set of processes using one section of the chamber and another set of processes using a different section of the chamber.

BACKGROUND OF THE INVENTION

A conventional process step in the manufacturing of integrated circuits and devices involves plating a conductive material on a semiconductor wafer or a workpiece surface. For example, an "electro chemical mechanical deposition" (ECMD) method can be used to achieve such a result. One goal of ECMD is to uniformly fill the holes and trenches on the wafer/workpiece surface with the conductive material while maintaining the planarity of the surface. The ECMD process is generally performed in a chamber specifically designed for such deposition. A more detailed description of the ECMD method and apparatus can be found in the co-pending U.S. application Ser. No. 09/201,929, entitled "Method and Apparatus For Electro Chemical Mechanical Deposition", commonly owned by the assignee of the present invention.

If a conventional plating process is performed to deposit the conductive material, after performing such step in a deposition chamber, the workpiece may be transferred to another chamber for polishing (e.g., chemical mechanical polishing). In other instances, for example, ECMD, the deposition and polishing process can be performed using a dual depositing/polishing tool in a combined deposition/polishing chamber.

Regardless of which process used, the workpiece is next transferred to a rinsing/cleaning chamber after the deposition and/or polishing steps. A robotic arm/machine that lifts the workpiece by its edges from, for example, the deposition/polishing chamber to another horizontally configured cleaning chamber can perform this transfer process. Additionally, a workpiece cassette may be used to store the workpiece as it is being transferred from the deposition/polishing chamber to the cleaning chamber. The workpiece surface can then be cleaned using, for example, a spin, rinse, and dry process, as known in the art.

During such transfer of the workpiece from one chamber to another, contaminants such as particles may attach themselves on the workpiece surface because the workpiece is exposed to the external environment. The source of these contaminants may be the surrounding air, the processing facility, personnel, process chemicals, or the like. In some cases, exposing the workpiece to light between processing steps may not be desirable. The workpiece surface must be free of such contaminants; otherwise, the contaminants may affect device performance characteristics and may cause device failure to occur at faster rates than usual. Thus, such contaminants can result in defective chips, which results in lost revenues and low overall process yield for the manufacturer.

In the conventional method and apparatus described above, the rinsing/cleaning and deposition/polishing chambers are at least two separate horizontally configured chambers that are located apart from each other. Thus, workpieces are exposed to potential contaminants as they are transferred from one chamber to another. In addition, more physical space in a clean room is occupied when multiple chambers are required. This increases the costs for manufactures as they must use larger facilities in order to use such chambers.

Although, example here is given for carrying out the depositing/polishing and rinsing/cleaning processes, there are other types of processes that are being carried out in other horizontally configured chambers. These processes include etching or otherwise modifying the workpiece surface, depositing different materials on the workpiece surface, etc. Regardless of the specific processes that are being carried out in these conventional chambers, the costs associated to operate such chambers are nevertheless very high for the reasons mentioned above.

Therefore, there is a need for methods and apparatus for carrying out multiple processes on a workpiece using a vertically configured chamber without exposing the workpiece to the external environment. There is also a particular need for methods and apparatus for depositing/polishing the conductive material on the workpiece surface and then rinsing/cleaning such surface without exposing the workpiece to contaminants. Accordingly, the present invention provides a vertically configured containment chamber that can be used for carrying out different processes on the workpiece surface. The containment chamber of the present invention can be specifically used for both depositing/polishing the conductive material and rinsing/cleaning the workpiece surface. The present invention further provides a more cost effective, efficient, contaminant free methods and apparatus than those currently available.

SUMMARY OF THE INVENTION

It is an object of the present invention to provide methods and apparatus for carrying out multiple processes in multiple sections of a vertically configured containment chamber.

It is another object of the present invention to provide methods and apparatus for carrying out multiple processes such as depositing, plating, polishing, etching, rinsing, cleaning, and modifying a conductive material and/or a substrate surface using a vertically configured containment chamber.

It is yet another object of the present invention to provide methods and apparatus that deposits a conductive material on a workpiece surface and then cleans the same surface in a vertically configured containment chamber.

It is another object of the present invention to provide methods and apparatus that deposits a conductive material on a workpiece surface using electro chemical mechanical deposition and cleans the same surface using a spin, rinse, and dry process in a vertically configured containment chamber.

It is a further object of the present invention to provide methods and apparatus that reduces/eliminates contaminants from being formed on the workpiece surface during multiple processing steps.

It is yet another object of the present invention to provide methods and apparatus for decreasing the physical space occupied by multiple chambers by providing a vertically configured containment chamber for multiple process.

It is yet another object of the present invention to provide methods and apparatus that efficiently deposits and cleans a workpiece surface in a vertically configured containment chamber.

These and other objects of the present invention are obtained by providing a vertically configured containment chamber that can be used for multiple processes such as depositing a conductive material on the workpiece surface and cleaning the same surface. In one specific embodiment of the present invention, an electo chemical mechanical deposition can be performed in the lower half of the containment chamber while a spin, rinse, and dry process can be performed in the upper half of the containment chamber. A movable process/rinse guard is positioned in between the lower and upper halves of the containment chamber such that the two halves of the chamber are physically separated from each other during processing in the upper half of the containment chamber. The movable process/rinse guard further prevents a cleaning solution from entering the lower half of the containment chamber.

In a second embodiment of the present invention, multiple flaps are used to separate the upper and lowers halves of the containment chamber. For example, when the flaps are in their vertical position, a depositing/polishing process can be performed in the lower half, and when the flaps are in their horizontal position, a rinsing/cleaning process can be performed in the upper half. In addition, when the flaps are in their horizontal position, loss of electrolyte solution from the containment chamber due to vaporization is minimized.

BRIEF DESCRIPTION OF THE DRAWINGS

These and other objects and advantages of the present invention will become apparent and more readily appreciated from the following detailed description of the presently preferred exemplary embodiments of the invention taken in conjunction with the accompanying drawings, of which.

DETAILED DESCRIPTION OF THE PREFERRED EMBODIMENTS

The preferred embodiments of the present invention will now be described with greater detail with reference to FIGS. 1–8. As described elsewhere herein, various refinements and substitutions of the various embodiments are possible based on the principles and teachings herein.

As noted above, conventional processing uses different processing chambers, at different times, to obtain a conductive material on the wafer surface and to rinse/clean/etch/modify/dry the same surface. Accordingly, the equipment cost needed for depositing, polishing, etching, rinsing, modifying the surface, drying, and cleaning can be high. The present invention contemplates using one vertically configured containment chamber that plates/deposits and/or polishes the conductive material on the workpiece/wafer, as well as rinses/cleans/etches/modifies/dries the workpiece/wafer surface. In other words, the present invention provides a vertically configured containment chamber used for carrying out multiple processes.

Furthermore, although a semiconductor wafer will now be used to describe the preferred embodiments of the present invention, other semiconductor workpieces such as flat panels or magnetic films may also be used in accordance with the present invention.

Figure 1:
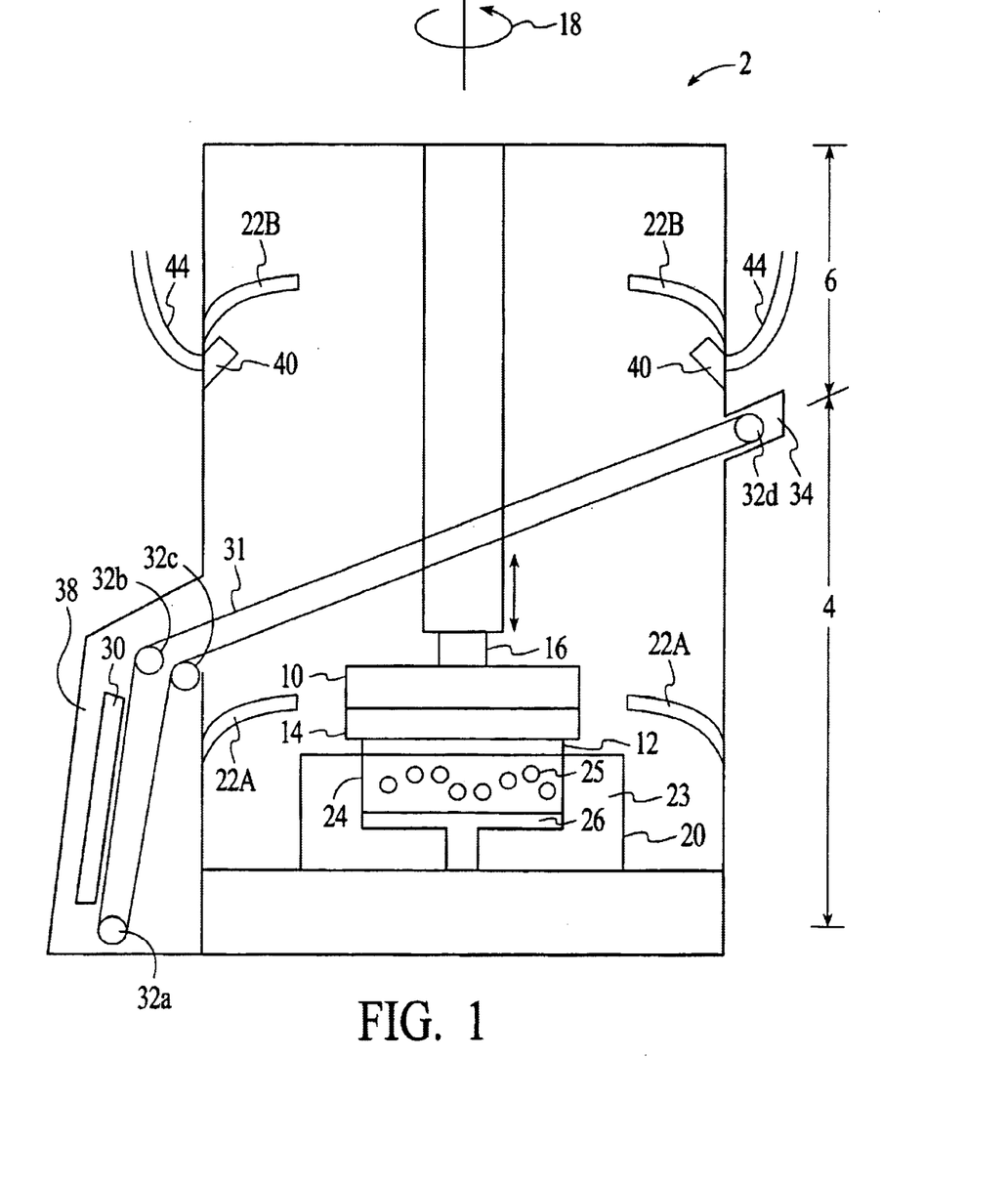
FIG. 1 illustrates a cross sectional view of a first preferred embodiment of the present invention for use during a depositing/polishing process.

FIG. 1 illustrates a cross sectional view of a first preferred embodiment of the present invention during the deposition process. A containment chamber 2 includes two sections, an ECMD lower section 4 and a rinsing/cleaning top section 6. The ECMD section 4 occupies the lower half of the containment chamber 2, and the cleaning section 6 occupies the upper half of the containment chamber 2. In the first mode of operation, an ECMD process is performed in the ECMD section 4, and in the second mode of operation, a rinsing/cleaning process is performed in the cleaning section 6.

FIG. 1 illustrates the first mode of operation in accordance with the first preferred embodiment of the present invention. A wafer holder 10 supports a wafer 12 as ECMD is performed in the ECMD section 4. The wafer holder 10 may include a nonconductive, preferably circular, chuck 14 with a cavity (not shown) that is preferably a few millimeters deep at its center and which cavity may contain a resting pad (not shown). The wafer 12 is loaded into the cavity, backside first, against the resting pad using a conventional type of transport or vacuum mechanism to ensure that the wafer 12 is stationary and secure with respect to the wafer holder 10 while in use. A shaft 16 is used to raise and lower the wafer holder 10 within the containment chamber 2. The shaft 16 is further adapted to move side to side and to rotate about axis 18, thus allowing the wafer holder 10 and the wafer 12 to move side to side and rotate about the same axis 18. Other conventional wafer holders can be used in accordance with the present invention.

During the ECMD process, a conductive material is applied in holes, trenches, and/or other desired areas on the wafer 12 using an electrolyte solution held in an ECMD apparatus 20. In the example provided herein, the ECMD apparatus 20 includes a pad assembly 23 having a pad 24 placed on an anode 26 for depositing and/or polishing the conductive material on the wafer 12. The electrolyte solution (not shown) may be held in the ECMD apparatus 20 or flowed through the pad 24. In one embodiment, the pad 24 may include pores 25 so that the electrolyte solution can be held and/or flowed through the pad 24. The term "pores" herein is broadly defined as any type of perforation in the pad 24 that allows the electrolyte to flow from the bottom surface to the upper surface of the pad 24. Also, in the preferred embodiment, the pad 24 should be an abrasive pad or at a minimum, the pad surface facing the wafer 12 should be abrasive.

In another embodiment, the ECMD apparatus 20 may include a pad assembly having a circular or square pad mounted on a cylindrical anode that rotates around another axis. Such apparatus is described in the co-pending U.S. application Ser. No. 09/201,929, entitled "Method and Apparatus For Electro Chemical Mechanical Deposition", commonly owned by the assignee of the present invention. Although two embodiments of the ECMD apparatus 20 are described herein, other ECMD apparatus and methods may be used in accordance with the present invention. What is important to note from the previous examples is that the ECMD process is performed in the lower section of the containment chamber 2.

In the ECMD process, chemical/electrochemical etching of the workpiece surface can also be carried out by controlling the potential difference between the wafer surface and the anode 26. For example, when applying a potential difference where the anode is more positive than the wafer surface, deposition may be performed. On the other hand, when applying a potential difference where the anode is more negative than the wafer surface, electrochemical etching may be performed. Furthermore, when a potential difference between the anode and the wafer surface is zero, chemical etching of the wafer surface may be performed.

Additionally, in the ECMD section 4, splashguards 22A may be used and extend out from the inner walls of the containment chamber 2. The splashguards 22A prevent the electrolyte solution from exiting from the ECMD section 4 to the top section of the chamber 2. Further, as described in more detail below, the splashguards 22A also prevent a cleaning solution from the top section of the chamber 2 from entering the ECMD apparatus 20.

Figure 2:
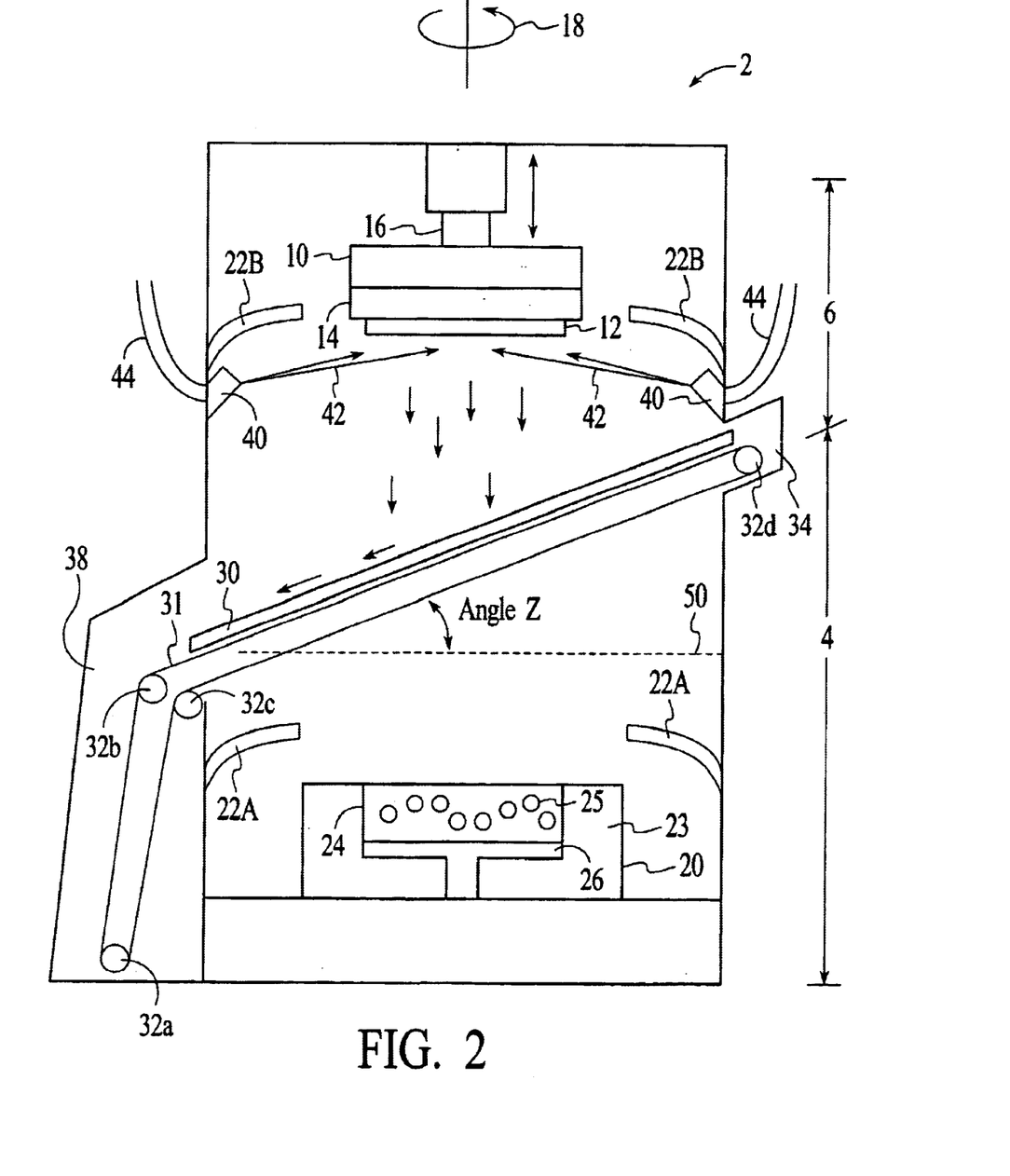
FIG. 2 illustrates a cross sectional view of a first preferred embodiment of the present invention for use during a rinsing/cleaning process.

FIG. 2 illustrates a cross sectional view of a second mode of operation in accordance with the first preferred embodiment of the present invention. The rinsing/cleaning section 6 includes the upper half of the containment chamber 2. The border/barrier between the cleaning section 6 and the ECMD section 4 is determined by a process guard 30 that is attached to a process guard support 31. The process guard support 31 may be in the form of a pair of tensioned cords that are looped around idle rollers 32b, 32c, 32d, and the motor driven roller 32a. The motor driven roller 32a allows the process guard support 31 and the process guard 30 to move in and out of the chamber 2. As shown, the process guard 30 and the support 31 are positioned at an angle Z from the horizontal plane 50. In the preferred embodiment, the angle Z from a horizontal plane 50 to the plane of the process guard 30 is between 5–60 degrees (or any other angle Z such that the cleaning solution can be flowed out of the chamber 2). Such incline of the process guard 30 is required such that the cleaning solution can be flowed out of the containment chamber 2 after cleaning/rinsing the wafer 12.

One end of the process guard 30 fits into slit 34 and the other end into a housing 38 along the two side walls of the containment chamber 2 such that a physical border is formed between the ECMD section 4 and the cleaning section 6. Other methods of supporting the process guard 30 and the process guard support 31 in the containment chamber 2 may be used in the present invention. The process guard 30 is moved in and out of the housing 38 via the set of rollers 32a, 32b, 32c, and 32d, which move the process guard support 31. The roller 32a is preferably attached to a mechanical device capable of rotating the roller 32a in both clockwise and counterclockwise directions so that one end of the process guard 30 can be moved from one wall to the opposite wall so as to form a temporary border between the two sections 4, 6. In other embodiments, other devices and methods may be used to move and position the process guard 30 from the housing 38 to the containment chamber 2 to the position as shown in FIG. 2.

Figure 3:
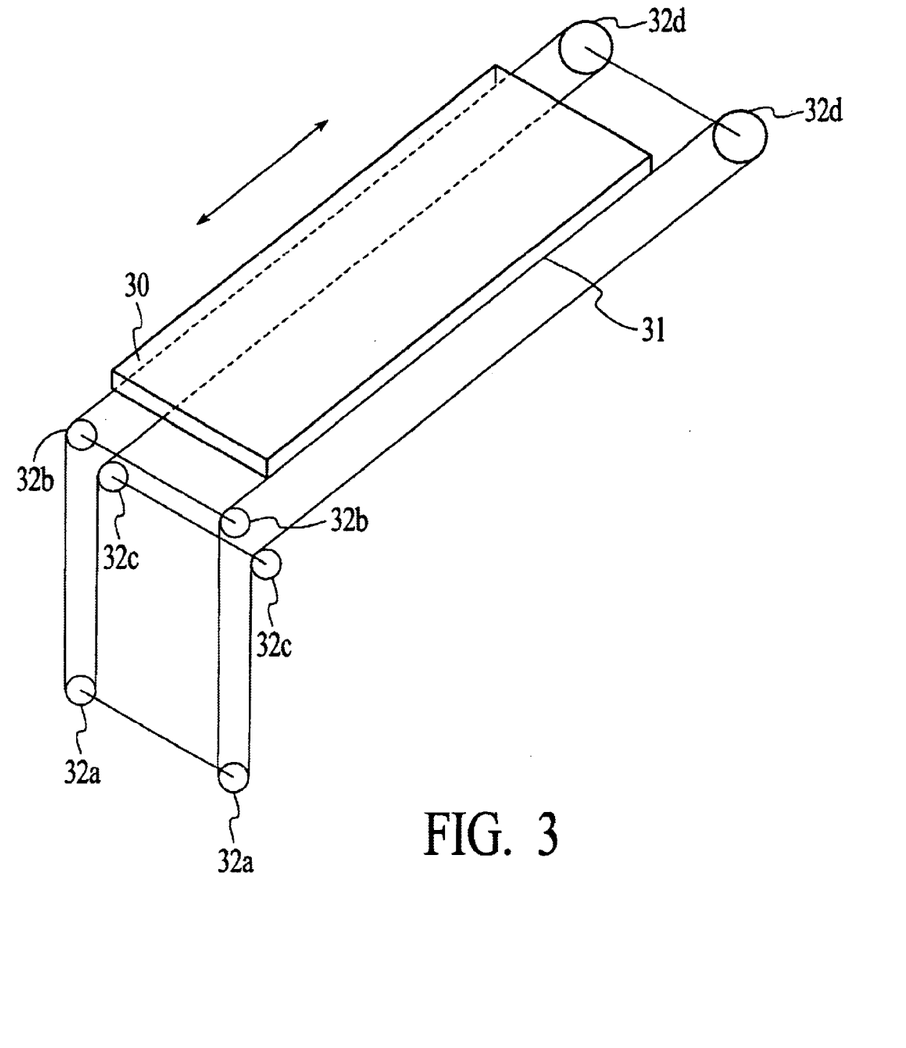
FIG. 3 illustrates a perspective view of a process guard support mechanism in accordance with the first preferred embodiment of the present invention.

FIG. 3 illustrates a perspective view of the process guard support mechanism in accordance with the first preferred embodiment of the present invention. This figure illustrates the process guard 30 and process guard support 31 positioned in the second mode of operation where the rinsing/cleaning step is performed. An adhesive, screw and nut, or the like can be used to attach the bottom side of the process guard 30 to the process guard support 31.

The process guard 30 is made from a material that is rigid enough to support the cleaning solution as it is flowed out of the cleaning section 6, while being flexible enough to bend as it is being stored in the housing 38. Preferably, the process guard 30 and the support 31 are made from materials such as plastic, metals, or coated metals that are compatible with the chemical used in the chamber. The process guard 30 is shaped in a configuration that fits inside the containment chamber 2 such that the cleaning solution is prevented from entering the ECMD section 4.

Referring back to FIG. 2, the cleaning section 6 further includes multiple nozzles 40 for spraying the rinsing/cleaning solution 42 onto the wafer 12. An inlet tube 44 is used to flow the cleaning solution through the nozzles 40. The cleaning solution 42 may be water, acidic or basic solutions or organic solvents. A second set of splashguards 22B may be positioned in the cleaning section 6 so as to prevent the cleaning solution 42 from exiting from the top section of the containment chamber 2.

In operation according to the first preferred embodiment of the present invention, after performing the ECMD process as described earlier, the wafer holder 10 supporting the wafer 12 is vertically raised from the deposition section 4 such that it is positioned in the cleaning section chamber 6 for the rinse, spin, and dry process. The wafer holder 10 is vertically raised in between the process guard support 331 (i.e., two sets of cords) (FIG. 3). The process guard 30 is then guided by the process guard support 31 using rollers 32a, 32b, 32c, 32d into the containment chamber 2 from the housing 38 so as to form a physical border between the two sections 4, 6. The process guard 30 should be flexible enough to bend during the guiding process from the housing 38 to the containment chamber 2, but should also be rigid enough to be guided into the slit 34. Any known apparatus and method may be used to guide the process guard 30 in and out of the housing 38. The rinsing/cleaning solution 42 is then applied to the wafer 12 through the nozzles 40. During this process, the rinsing/cleaning solution 42 that drips onto the process guard 30 is flowed to the housing 38 or an outside reservoir (not shown) for storage and/or disposal. The incline of the process guard 30 allows the used rinsing/cleaning solution 42 to flow out of the containment chamber 2.

The cleaning process of the present invention is a spin, rinse, and dry process, as known in the art. The wafer holder 10 rotates the wafer 12 at a very high speed. The rinsing/cleaning solution 42 is applied/sprayed onto the wafer surface using nozzles 40. Once the spraying is completed, the wafer is dried by the rotation of the wafer holder 10. The wafer is then transferred to the next processing station.

The present invention contemplates adding another processing step such that the wafer 12 is cleaned before and after performing the ECMD. For example, the wafer 12 can be cleaned first in the cleaning section 6 before performing the ECMD process in ECMD section 4. Then, the wafer 12 can be cleaned for the second time in the cleaning section 6. The solution used in the cleaning section 6 may contain chemicals that can modify the surface of the wafer 12. For example, a mild etching solution can be used for this purpose.

Figure 4:
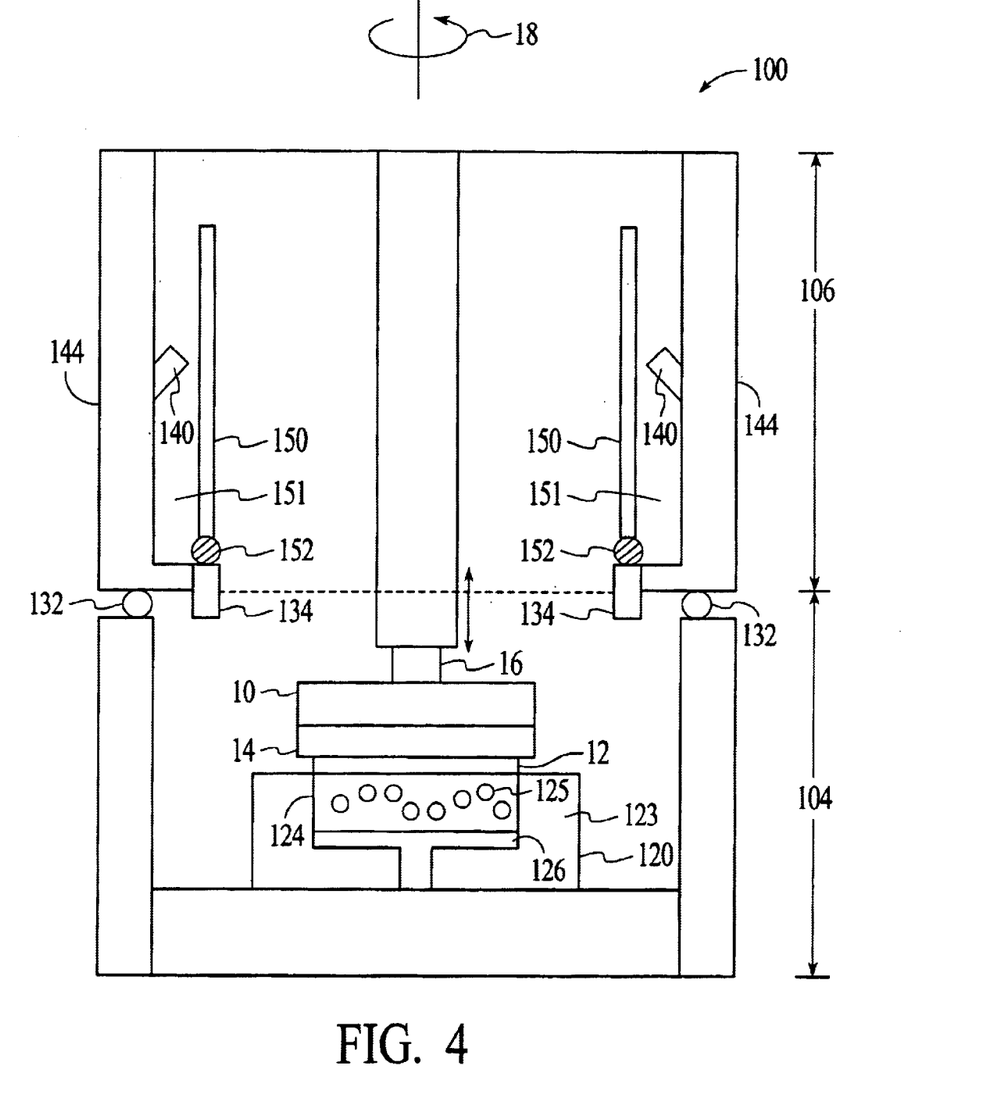
FIG. 4 illustrates a cross sectional view of a second preferred embodiment of the present invention for use during a depositing/polishing process.
Figure 5:
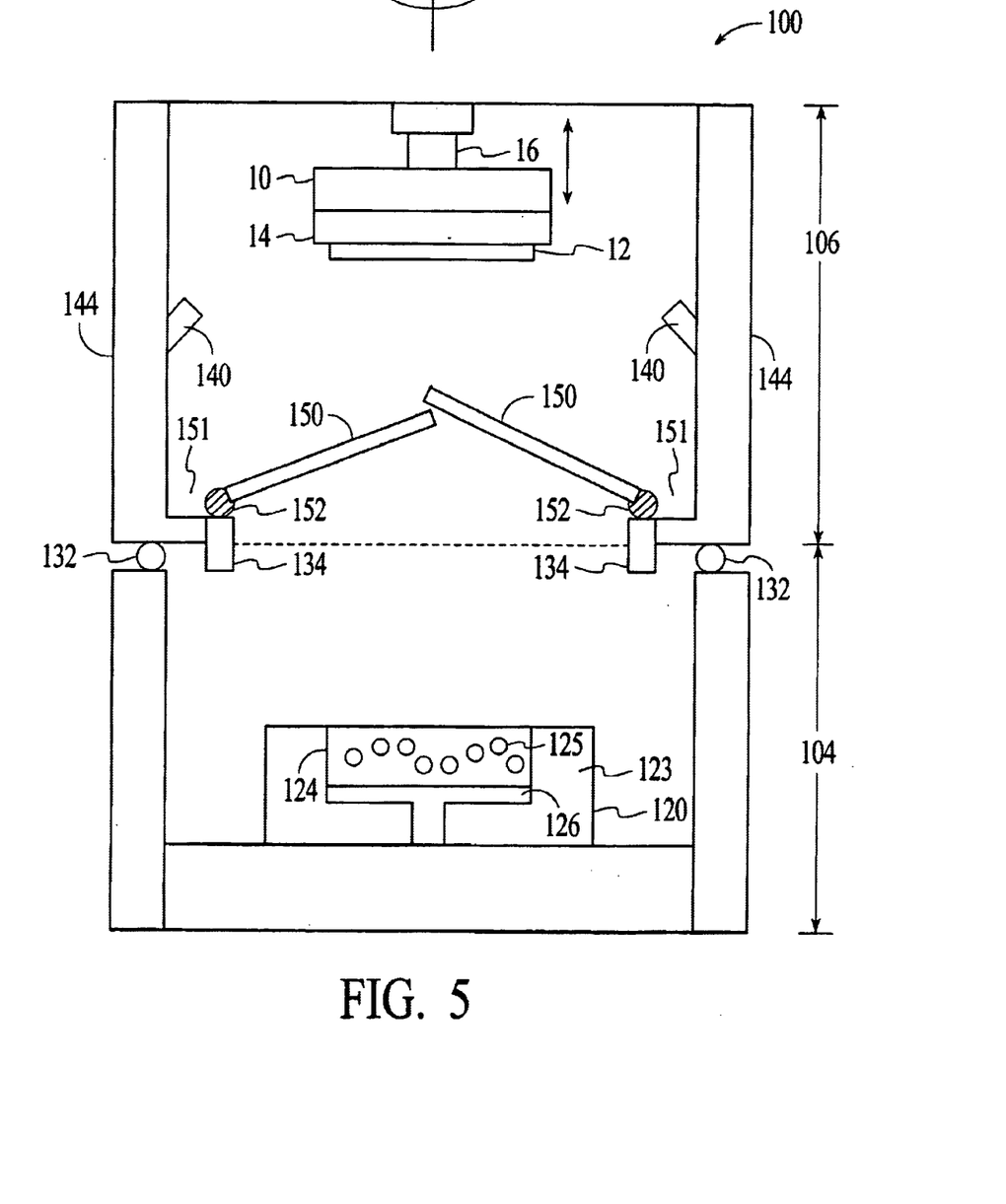
FIG. 5 illustrates a cross sectional view of a second preferred embodiment of the present invention during the transition from a depositing/polishing process to a rinsing/cleaning process.
Figure 6:
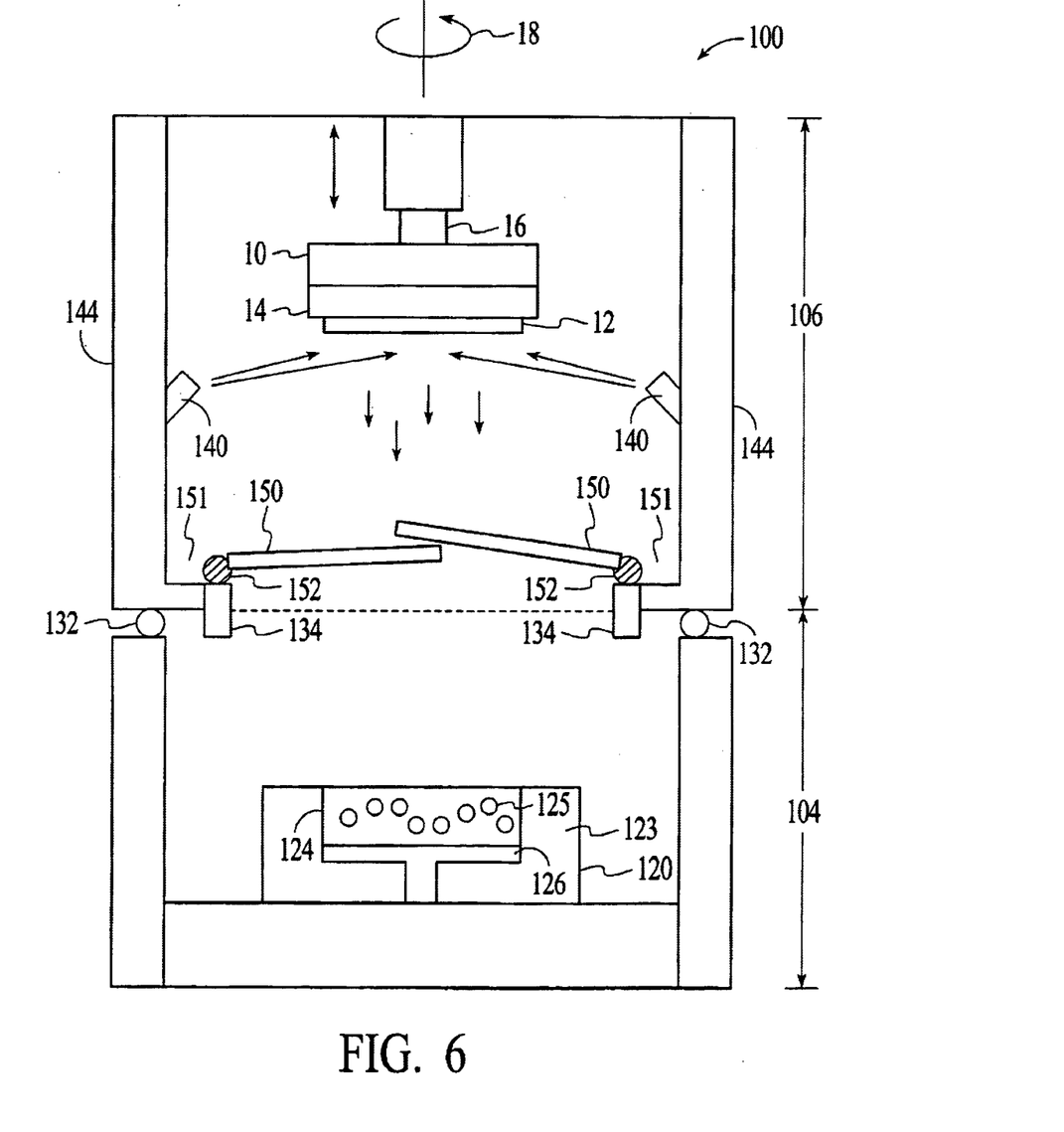
FIG. 6 illustrates a cross sectional view of a second preferred embodiment of the present invention for use during a rinsing/cleaning process.

FIGS. 4–7 illustrate cross sectional views of the second preferred embodiment of the present invention. In this second embodiment, multiple flaps are used to separate the lower processing section from the upper processing section. For example, when flaps 150 are in the vertical position as shown in FIG. 4, a first process can be performed in the lower section. On the other hand, when the flaps 150 are in the substantially horizontal position as shown in FIG. 6, a second process can be performed in the upper section.

Described hereinafter in greater detail is one possible application of the present invention where the first process that is carried out in the lower section is a depositing/polishing process and the second process that is carried out in the upper section is a rinsing/cleaning process.

Referring back to FIG. 4, a containment chamber 100 includes two sections similar to that described above, a depositing/polishing lower section 104 and a rinsing/cleaning top section 106. In the first mode of operation, a depositing/polishing is performed in the section 104, and in the second mode of operation, a rinsing/cleaning step is performed in the section 106.

In the first mode of operation in accordance with the second preferred embodiment of the present invention, a wafer holder 10, as described above, supports a wafer 12 as deposition and polishing process is performed in the lower section 104. The flaps 150 via linkage shafts/rollers 152 are positioned vertically such that the wafer holder 10 using shaft 16 can be lowered into the lower section 104.

During the deposition and polishing process, a conductive material is applied in holes, trenches, and/or other desired areas in the wafer 12 using an electrolyte solution while the conductive material is polished from undesired areas on the wafer. The deposition/polishing apparatus 120 is similar to that described earlier herein. In the example provided herein, the apparatus 120 includes a pad assembly 123 having a pad 124 placed on an anode 126 for depositing/polishing the conductive material on the wafer 12. The chamber 100 also includes sealing and anti-splash portion 134 and O-ring 132 to prevent any solution from exiting the chamber 100.

FIG. 5 illustrates a cross sectional view of a second preferred embodiment of the present invention during the transition from a depositing/polishing process to a rinsing/cleaning process. After the deposition and polishing process in the lower section 104, the wafer holder 10 is raised using shaft 16 to approximately its uppermost position. The flaps 150 are then moved from their vertical position to their horizontal position using the linkage shaft/rollers 152. Once the flaps 150 are in their final horizontal position, the second mode of operation (rinsing/cleaning) can be carried out.

FIG. 6 illustrates a cross sectional view of a second preferred embodiment of the present invention for use during a rinsing/cleaning process. From its uppermost position of the wafer holder 10 in FIG. 5, the wafer holder 10 is lowered slightly to a position that is suitable for rinsing/cleaning the wafer 12. The rinsing/cleaning process of the wafer 12 is similar to that described earlier herein, where the rinsing cleaning solution is provided via nozzles 140 and other inlet tubes that are commonly used in this field. In other embodiments, the wafer 12 may be brush cleaned using a brush as known in the art. It should be noted that the used rinsing/cleaning solution that drips down from the wafer 12 is guided by the flaps 150 into outlet channels 151 along the side walls of the upper section 106. In this manner, the used solution is drained out of the chamber 100 using outlet channels 151, which is described in more detail below.

The flaps 150 are made from a material that is rigid enough to support the cleaning solution as it is flowed out of the rinsing/cleaning section 106. Preferably, the flaps 150 are made from materials such as plastic or teflon, or any other material that is compatible with the chemical used in the chamber.

An additional advantage of using the second embodiment of the present invention is that when the chamber 100 is not being used, the flaps 150 can be positioned in a horizontal position to enclose the lower section 104 of the chamber 100. When the lower section 104 is enclosed using flaps 150, this reduces/minimizes electrolyte solution evaporation from the chamber 100, thereby saving money and resources for the manufacturer.

During the rinsing/cleaning process according to either the first or second preferred embodiments, the wafer 12 can be rotated using the wafer holder 10 at 5 to 200 rpm, but preferably between 10 to 150 rpm. The rinsing/cleaning solution can be applied to the wafer 12 at 2 to 2000 ml/minute, but preferably between 5 to 800 ml/minute for a period ranging from 5 to 15 seconds. Thereafter, the wafer 12 may be spun dried by rotating the wafer 12 at 500 to 2500 rpm, but preferably between 800 to 2000 rpm for a period of about 10 seconds. After such rinsing/cleaning process, the wafer 12 can be transferred from the either chamber 2, 100 using the wafer holder 10 to another processing device.

Figure 7:
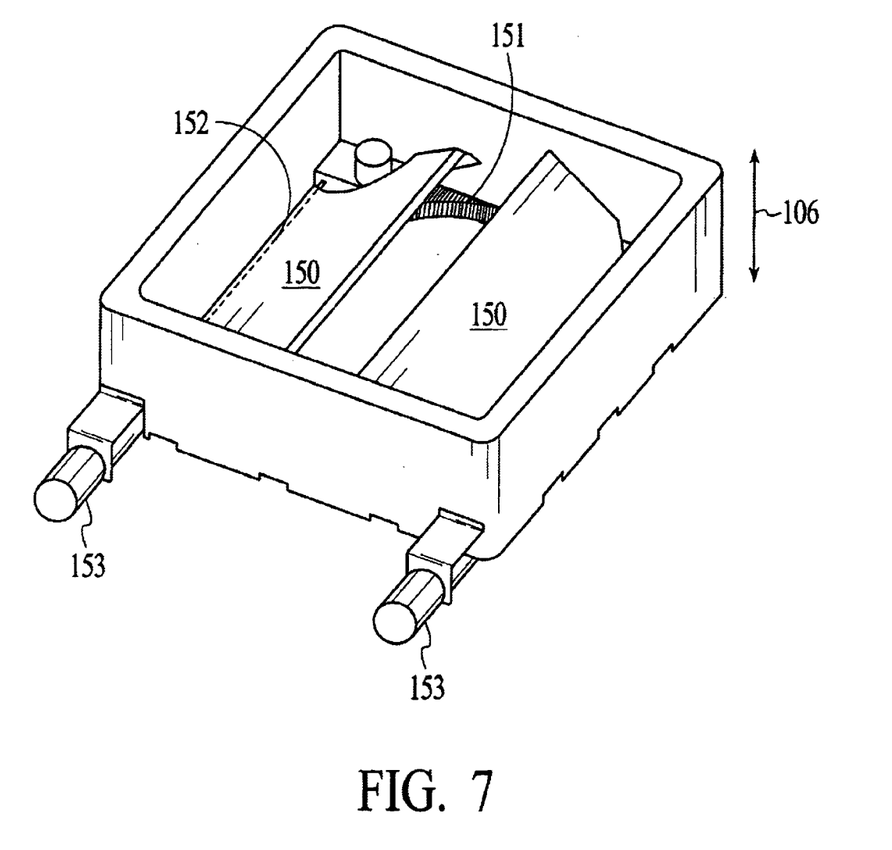
FIG. 7 illustrates a perspective view of the upper chamber in accordance with the second preferred embodiment of the present invention.

FIG. 7 illustrates a perspective view of the upper chamber in accordance with the second preferred embodiment of the present invention. Flaps 150 can be moved up and down around the axis of the linkage shaft/rollers 152 using motors 153. Further, the flaps 150 are designed such that when they are in the closed position, the used solution falling on the flaps 150 is flowed into the outlet channels 151 along the walls of the upper section 106. The used solution is then drained from the outlet channels 151 into a reservoir (not shown) for recycling and/or disposal.

Figure 8:
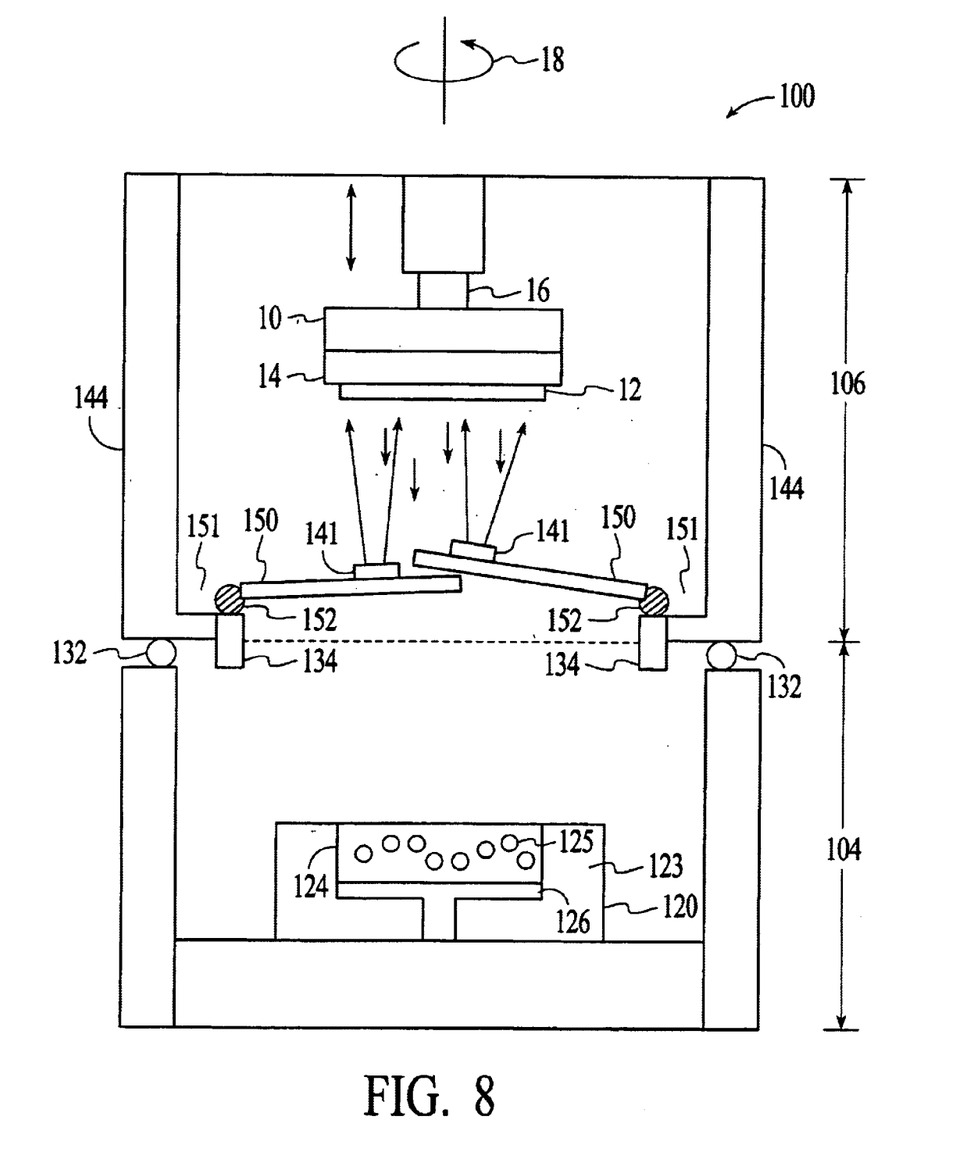
FIG. 8 illustrates a cross sectional view of yet another preferred embodiment of the present invention.

FIG. 8 illustrates a cross sectional view of yet another preferred embodiment of the present invention. In this embodiment, the wafer 12 is rinsed through sprayers 141 that are mounted on the flaps 150. The rinsing/cleaning solution can be fed to the sprayers 141 through various tubes/pipes that are located either inside/outside the flaps 150. Although FIG. 8 illustrates one sprayer 141 mounted per each flap 150, more or less than one sprayer can be mounted on either flap 150.

Sprayers 141 can also be used to blow air/gases such that the wafer 12 can be dried quickly. It is also possible to use different sprayers that are used for different purposes (i.e., one for liquid and one for gas). In other embodiments, both the sprayers mounted on the flaps 150 (FIG. 8) and side mounted nozzles (FIG. 6) can be used to simultaneously rinse/clean the wafer 12.

Although a specific application of the present invention involving deposition in the lower section and rinsing/cleaning in the upper section has been described in detail, the present invention contemplates performing other types of processes in the upper and lower sections, which sections are separated by the movable process guard or flaps. In this case, the nozzles and/or sprayers can be used to provide various "process solutions" or "process gases" to the wafer surface. For example, as described above, if the upper section is used for cleaning, the process solution can be a cleaning solution. If, on the other hand, the process in the upper section is an etching or surface modification process, then the process solution may be a mild etching solution. Furthermore, process gases such as $O_2$, $CF_4$, $CL_2$, $NH_2$, etc., can be introduced onto the wafer surface in the upper section. The wafer may also be heated (using lamp, etc.)

when the gas is introduced such that surface modifications can result. For example, $O_2$ gas may be used to oxidize the wafer surface prior to performing the next processing step in the lower section.

In other instances, the upper section may be used for deposition, which in this case, the process solution may contain chemicals that cause film growth on the wafer surface as a result of the applied solution. Electroless material deposition solutions such as electroless nickel, palladium, gold, copper, platinum, and the like are examples of process solutions that can be used in the upper section to deposit a film on the wafer surface.

The processing sequence as described above in the upper and lower sections may be changed, thus allowing for multiple processes to be carried out in each section. For example, the wafer surface may first be cleaned, etched, modified, etc., using a cleaning/etching solution in the upper section with the flaps/process guard in their/its appropriate position(s). After cleaning/etching the wafer surface, the wafer can further be rinsed/dried again in the upper section. Thereafter, after repositioning the flaps/process guard, the wafer can be lowered into the lower section where metal deposition and polishing can be carried out. The deposited metal may be Cu, Au, Pt, Ni, Co, Ni—Co alloy, and the like. After deposition, the wafer can again be raised to the upper section such that the wafer surface can be cleaned. After this cleaning process, a deposition step can be carried out in the upper section, as described above. For example, after Ni deposition in the lower section, Au may be deposited over the Ni film in the upper section using an electroless Au solution applied (using nozzles/sprayers) over the Ni coated wafer surface. The Au solution and the wafer may further be heated at this stage. After deposition in the upper chamber, another rinsing and cleaning process can be carried out in upper section.

From the previous discussion, an important aspect of this invention is that it provides a vertically configured chamber such that multiple processes can be carried out in the different sections of the chamber. Sections are separated from each other using a removable process guard or flaps such that one chemistry used in one section does not effect a different chemistry used in another section. Although the examples shown above discloses two sections, three or more sections can be used so long as the physical height of each section and the overall height of the chamber is kept within a reasonable limit.

For example, the vertically configured chamber can be sectioned off into three or more distinct sections having top, middle, and bottom sections. The top section can be used for first depositing the conductive material on the wafer surface using a first set of nozzles/sprayers and process guard/flaps, which process guard/flaps prevent(s) the depositing solution from entering the middle section, as described earlier herein. The wafer can then be lowered into the middle section after positioning the first process guard in its housing or the flaps in their vertical positions. The wafer surface can then be cleaned, rinsed, etc. using a second set of nozzles/sprayer and process guard/flaps, which process guard/flaps prevent(s) the cleaning, rinsing, etc., solutions from entering the bottom section of the chamber. The wafer can be further lowered into the bottom section of the chamber for additional deposition after positioning the second process guard in its housing or the flaps in their vertical positions. Thereafter, the wafer can be raised to the middle section for a second cleaning/rinsing. As can be appreciated, this process can continue allowing for multiple cleaning/rinsing and depositing steps.

Although specific embodiments, including specific apparatus, process steps, process parameters, materials, solutions, etc., have been described, various modifications to the disclosed embodiments will be apparent to one of ordinary skill in the art upon reading this disclosure. Therefore, it is to be understood that such embodiments are merely illustrative of and not restrictive of the broad invention and that this invention is not limited to the specific embodiments shown and described. Those skilled in the art will readily appreciate that many modifications of the exemplary embodiment are possible without materially departing from the novel teachings and advantages of this invention.

We claim:

1. A method of depositing a conductive material on a workpiece and cleaning the workpiece in a chamber, the method comprising the steps of:
   lowering the workpiece into a lower section of the chamber;
   depositing the conductive material on the workpiece in the lower section of the chamber;
   raising the workpiece from the lower section to an upper section of the chamber;
   positioning a movable guard between the lower section and the upper section; and
   cleaning the workpiece with a liquid in the upper section.

2. A method according to claim 1, wherein the lowering and raising steps comprise the step of providing a workpiece holder, wherein the workpiece holder is lowered and raised using a moveable shaft attached to the workpiece holder.

3. A method according to claim 1, wherein the depositing step further comprises the step of depositing the conductive material using an electro chemical mechanical deposition process.

4. A method according to claim 1, wherein the cleaning step further comprises the steps of:
   spinning the workpiece about a first axis;
   providing a cleaning solution to the workpiece; and
   drying the workpiece by spinning the workpiece.

5. A method according to claim 4, wherein the providing step further comprises spraying the cleaning solution from a plurality of nozzles positioned on the inner walls of the upper chamber.

6. A method according to claim 4, wherein the moveable guard comprises a plurality of flaps connected to linkage rollers and wherein the providing step further comprises spraying the cleaning solution from a plurality of sprayers positioned in the upper surfaces of the plurality of flaps.

7. A method according to claim 4, wherein the moveable guard comprises a flexible guard attached to a guard support.

8. A method according to claim 7, wherein the guard support comprises a plurality of cords coupled to a plurality of rollers.

9. A method according to claim 8, wherein the flexible guard is adapted to move into and out of the chamber using the guard support.

10. A method according to claim 4, further comprising a slit in an inner wall and a housing such that one end of the flexible guard can be positioned within the slit and the other end can be positioned within the housing.

11. A method according to claim 4, wherein after the cleaning solution has been provided to the workpiece, the solution is flowed out the chamber using the moveable guard.

12. A method according to claim 4, wherein the drying step further comprises blowing a dry gas to the workpiece.

13. A method according to claim 1, wherein the step of positioning the moveable guard includes the step of positioning the guard at an angle from a horizontal plane.

14. A method according to claim 13, wherein the angle is between 5–60 degrees.

15. A method of depositing a conductive material on a surface of a semiconductor workpiece and cleaning a top surface of the conductive material in a chamber comprising the steps:
- depositing the conductive material on the surface of the semiconductor workpiece in a lower section of the chamber;
- raising the workpiece to an upper section of the chamber;
- separating the lower section and the upper section with a movable guard; and
- cleaning the top surface of the workpiece with a cleaning liquid in the upper section.

16. A method according to claim 15, further comprising the step of directing the cleaning liquid away from the lower section of the chamber to a reservoir.

17. A method according to claim 16, wherein the step of directing includes isolating the cleaning liquid from solution contained in the lower section to prevent contamination of the solution by the cleaning liquid.

18. A method according to claim 15, wherein the movable guard includes a single guard and the step of separating includes sliding the single guard between the lower section and the upper section of the chamber.

19. A method according to claim 15, wherein the movable guard includes a first guard flap and a second guard flap and the step of separating includes closing the first guard flap and the second guard flap.

20. A method according to claim 15, wherein the step of depositing includes electro chemical deposition.

* * * * *